US008536551B2

(12) United States Patent
Moriya et al.

(10) Patent No.: US 8,536,551 B2
(45) Date of Patent: Sep. 17, 2013

(54) EXTREME ULTRA VIOLET LIGHT SOURCE APPARATUS

(75) Inventors: Masato Moriya, Hiratsuka (JP); Osamu Wakabayashi, Hiratsuka (JP); Tamotsu Abe, Hiratsuka (JP); Takashi Suganuma, Hiratsuka (JP); Akira Endo, Hiratsuka (JP); Akira Sumitani, Hiratsuka (JP)

(73) Assignee: Gigaphoton Inc., Oyama-Shi (JP)

( * ) Notice: Subject to any disclaimer, the term of this patent is extended or adjusted under 35 U.S.C. 154(b) by 440 days.

(21) Appl. No.: 12/482,796

(22) Filed: Jun. 11, 2009

(65) Prior Publication Data

US 2009/0314967 A1 Dec. 24, 2009

(30) Foreign Application Priority Data

Jun. 12, 2008 (JP) .................. 2008-154012

(51) Int. Cl.
*G21K 5/00* (2006.01)
(52) U.S. Cl.
USPC .............. 250/504 R; 250/493.1; 250/498.1; 250/503.1; 359/350; 359/351; 359/355; 359/359; 359/361

(58) Field of Classification Search
USPC ............... 250/493.1, 494.1, 503.1, 504 R; 359/350, 351, 352, 355, 359, 361, 885
See application file for complete search history.

(56) References Cited

U.S. PATENT DOCUMENTS

| 6,522,465 | B1 | 2/2003 | Goldstein |
| 6,809,327 | B2 | 10/2004 | Bristol |
| 2003/0206340 | A1* | 11/2003 | Goldstein ............. 359/361 |
| 2004/0227923 | A1 | 11/2004 | Flagello et al. |
| 2004/0238762 | A1* | 12/2004 | Mizoguchi et al. ....... 250/504 R |
| 2006/0181689 | A1* | 8/2006 | Phillips et al. ................. 355/53 |
| 2006/0221440 | A1* | 10/2006 | Banine et al. ................ 359/359 |
| 2007/0002474 | A1* | 1/2007 | Amemiya et al. ........... 359/857 |
| 2007/0080307 | A1 | 4/2007 | Bruijn et al. |
| 2007/0102653 | A1* | 5/2007 | Bowering et al. ......... 250/504 R |
| 2007/0170379 | A1* | 7/2007 | Watson et al. ............. 250/515.1 |
| 2008/0069157 | A1 | 3/2008 | Ariga et al. |
| 2009/0219617 | A1 | 9/2009 | Asakawa et al. |
| 2009/0250637 | A1* | 10/2009 | Akins et al. ................ 250/492.1 |

FOREIGN PATENT DOCUMENTS

| JP | 2000-186958 A | 7/2000 |
| JP | 2003-008124 A | 1/2003 |
| JP | 2004-103773 A | 4/2004 |

(Continued)

OTHER PUBLICATIONS

Japanese Office Action with English translation issued in Japanese Application No. 2009-141103 dated Jun. 18, 2013.

*Primary Examiner* — Nicole Ippolito
(74) *Attorney, Agent, or Firm* — McDermott Will & Emery LLP

(57) ABSTRACT

An extreme ultraviolet light source apparatus using a spectrum purity filter capable of obtaining EUV light with high spectrum purity. The apparatus includes a chamber; a target supply unit for supplying a target material; a driver laser using a laser gas containing a carbon dioxide gas as a laser medium, for applying a laser beam to the target material to generate plasma; a collector mirror for collecting and outputting the extreme ultraviolet light radiated from the plasma; and a spectrum purity filter provided in an optical path of the extreme ultraviolet light, for transmitting the extreme ultraviolet light and reflecting the laser beam, the spectrum purity filter including a mesh having electrical conductivity and formed with an arrangement of apertures having a pitch not larger than a half of a shortest wavelength of the laser beam applied by the driver laser.

14 Claims, 13 Drawing Sheets

(56) References Cited

FOREIGN PATENT DOCUMENTS

| JP | 2004-258670 A | 9/2004 |
| JP | 2006-191090 | 7/2006 |
| JP | 2007-128087 A | 5/2007 |
| JP | 2007-129209 | 5/2007 |
| JP | 2007-129209 A | 5/2007 |
| JP | 2008-085292 A | 4/2008 |

* cited by examiner

41
WIRE GRID POLARIZER

FIG.14A

| BAND OF TRANSITION 00°1−10°0 | WAVELENGTH IN VACUUM ($\mu$m) |
|---|---|
| P(12) | 10.5135 |
| P(14) | 10.5326 |
| P(16) | 10.5518 |
| P(18) | 10.5713 |
| P(20) | 10.5912 |
| P(22) | 10.6118 |
| P(24) | 10.6324 |
| P(26) | 10.6534 |
| P(28) | 10.6748 |
| P(30) | 10.6965 |
| P(32) | 10.7194 |
| P(34) | 10.7415 |
| P(36) | 10.7648 |
| P(38) | 10.7880 |

FIG.14B

| BAND OF TRANSITION 00°1−02°0 | WAVELENGTH IN VACUUM ($\mu$m) |
|---|---|
| P(22) | 9.5691 |
| P(24) | 9.5862 |
| P(26) | 9.6063 |
| P(28) | 9.6211 |
| P(30) | 9.6391 |
| P(32) | 9.6576 |
| P(34) | 9.6762 |

EXTREME ULTRA VIOLET LIGHT SOURCE APPARATUS

CROSS-REFERENCE TO RELATED APPLICATION

The present application claims priority from Japanese Patent Application No. 2008-154012 filed on Jun. 12, 2008, the contents of which are incorporated herein by reference in their entirety.

BACKGROUND OF THE INVENTION

1. Field of the Invention

The present invention relates to an extreme ultraviolet (EUV) light source apparatus for generating extreme ultraviolet light by applying a laser beam to a target material to turn the target material into plasma, and specifically, to an EUV light source apparatus for supplying high-quality extreme ultraviolet light with spectrum purity improved by eliminating the influence of the laser beam applied to the target material.

2. Description of a Related Art

Recent years, as semiconductor processes become finer, photolithography has been making rapid progress to finer fabrication. In the next generation, microfabrication at 70 nm through 45 nm, further, microfabrication at 32 nm and beyond will be required. Accordingly, in order to fulfill the requirement for microfabrication at 32 nm and beyond, for example, exposure equipment is expected to be developed by combining an EUV light source generating EUV light having a wavelength of about 13 nm and reduced projection reflective optics.

As the EUV light source, there is an LPP (laser produced plasma) light source using plasma generated by applying a laser beam to a target (hereinafter, also referred to as "LPP type EUV light source apparatus").

In the LPP type EUV light source apparatus, a target material is injected from a nozzle and a laser beam is applied toward the target material, and thereby, the target material is excited and turned into plasma. Various wavelength components including extreme ultraviolet (EUV) light are radiated from the plasma.

Accordingly, a desired EUV light is selected using a collector mirror (EUV collector mirror) for selectively reflecting and collecting a desired wavelength, and the desired EUV light is output to external equipment such as an exposure unit. For example, when EUV light having a wavelength near 13.5 nm is collected, an EUV collector mirror having a reflecting surface is used on which a multilayer film with alternately stacked molybdenum and silicon (Mo/Si multilayer film) is formed.

However, also the light directly radiated from the target plasma and excitation laser beam reflected from the target and so on are mixed in the desired EUV light. A resist for exposure to be used in the EUV exposure unit is exposed to light having a wavelength from 130 nm to 400 nm in the spectrum of light generated from the target plasma, and it may reduce the exposure contrast. Further, infrared light contained in the excitation laser beam may be absorbed by optical parts, masks, wafers, and so on, to cause thermal expansion, and it may reduce the accuracy of patterning. Therefore, it is necessary to suppress those light components.

Conventionally, in the LPP type EUV light source apparatus, a spectrum purity filter (SPF) has been used for removing components unnecessary for EUV exposure from the spectrum of light radiated from plasma. In a technology disclosed in U.S. Pat. No. 6,809,327 B2, as shown in FIG. 17, a laser beam emitted from a carbon dioxide ($CO_2$) laser is introduced into a vacuum chamber and focused, the laser beam is applied to a target of tin (Sn) droplets or the like supplied by a target supply unit to turn the target into plasma, light radiated from the plasma is collected by an EUV collector mirror, and the collected light is spectrum-separated by a grating type SPF, and thereby, only the EUV light having a wavelength around 13.5 nm (negative first-order light in the drawing) is guided to an exposure unit.

Further, by providing a thin film filter between the exposure unit and the vacuum chamber, Sn debris flying from the target material (Sn) introduced into the vacuum chamber and the target plasma is prevented from flowing to the exposure unit side and contaminating optical parts within the exposure unit. When a material such as zirconium (Zr) or silicon (Si) with higher transmittance for EUV light having a wavelength around 13.5 nm than for other wavelengths is selected, the thin film filter also serves as a thin film filter type SPF. In the conventional LPP type EUV light source apparatus as shown in FIG. 17, the light spectrum-separated and eliminated by the grating type SPF is absorbed by a dumper and turns into thermal energy.

Further, Japanese Patent Application Publication JP-P2006-191090A discloses another SPF using apertures or an aperture array for reflecting light having a longer wavelength than twice the width of the aperture to suppress transmission of the light.

Furthermore, Japanese Patent Application Publication JP-P2007-129209A discloses using, as an SPF, a gas curtain formed by combining necessary kinds of gases that do not have absorption capability for EUV light but have absorption capability for wavelengths to be eliminated.

Especially, in the LPP type EUV light source apparatus using a $CO_2$ laser beam (infrared light having a wavelength of 10.6 μm) for excitation of the Sn target, the $CO_2$ laser beam having high-power is also reflected or scattered by the target or the like, and it is necessary to remove the $CO_2$ laser beam by the SPF. For example, assuming that the intensity of the EUV light with the center wavelength of 13.5 nm is "1", the intensity of the $CO_2$ laser beam is required to be suppressed to about "0.1" or less. Accordingly, in view of removal of the $CO_2$ laser beam, there have been the following problems in the above-mentioned conventional technologies.

(1) Since the transmittance of the thin film filter type SPF that isolates the exposure unit from the EUV light source apparatus is as low as about 40%, the output efficiency of EUV light is very poor. Further, the thin film is easily broken by the incidence of debris. Furthermore, when debris adheres to the thin film, the debris absorbs EUV light and the temperature rises, and the filter itself may be melted, and therefore, it is difficult to maintain the function as the SPF.

(2) In the SPF using an aperture array, there are issues of improving the efficiency of EUV light to be outputted to the exposure unit by improving the aperture ratio while maintaining the structural strength of the SPF, improving the reflectance of the $CO_2$ laser beam to be blocked, and reducing the risk of deformation and breakage due to temperature rise caused by light absorption. Further, the fine intensity distribution of EUV light generated in the aperture array may disturb the exposure uniformity of the semiconductor and cause exposure variations.

(3) In the SPF utilizing the selective absorption of gases, no kinds of gases suitable for absorption of $CO_2$ laser beam is disclosed.

SUMMARY OF THE INVENTION

The present invention has been achieved in view of the above-mentioned problems. The purpose of the present invention is to provide an EUV light source apparatus using a spectrum purity filter (SPF) capable of obtaining EUV light with high spectrum purity.

In order to accomplish the above-mentioned purpose, an extreme ultraviolet light source apparatus according to one aspect of the present invention is a laser produced plasma type extreme ultraviolet light source apparatus for generating extreme ultraviolet light by applying a laser beam to a target material, and the apparatus includes: a chamber in which extreme ultraviolet light is generated; target supply means for supplying a target material to a predetermined position within the chamber; a driver laser using a laser gas containing a carbon dioxide gas as a laser medium, for applying a laser beam to the target material supplied by the target supply means to generate plasma; a collector mirror for collecting the extreme ultraviolet light radiated from the plasma to output the extreme ultraviolet light; and a spectrum purity filter provided in an optical path of the extreme ultraviolet light outputted from the collector mirror, for transmitting the extreme ultraviolet light and reflecting the laser beam, the spectrum purity filter including a mesh having electrical conductivity and formed with an arrangement of apertures having a pitch not larger than a half of a shortest wavelength of the laser beam applied by the driver laser. The mesh may be formed of a material having electrical conductivity, or may be formed by coating a material having electrical conductivity on at least a light incident surface or a back or a sidewall thereof.

According to the one aspect of the present invention, by using the spectrum purity filter (SPF) including the mesh formed with an arrangement of apertures having a pitch not larger than a half of a shortest wavelength of the laser beam applied by the driver laser, the EUV light having a short wavelength is transmitted and the $CO_2$ laser beam having a long wavelength is reflected, and thereby, EUV light having high spectrum purity can be obtained. Further, in the case of providing a metal coating of gold, molybdenum, or the like to the light incident surface of the mesh, the $CO_2$ laser beam becomes hard to be absorbed by the light incident surface of the mesh of the SPF, and the risk of deformation and breakage caused by temperature rise of the SPF is reduced.

Since an oscillation wavelength of a general $CO_2$ gas laser is 10.6 μm, an SPF formed with an arrangement of apertures having a pitch not larger than a half of a wavelength of the laser beam, that is, a pitch not larger than 5.3 μm may be used. Further, in the case where a $CO_2$ gas laser oscillates in a band of transition 00°1-02°0, an oscillation wavelength of the $CO_2$ gas laser becomes nearly 9.56 μm. In this case, an SPF formed with an arrangement of apertures having a pitch not larger than a half of a wavelength of the laser beam, that is, a pitch not larger than 4.78 μm may be used. As mentioned above, in order to reflect the $CO_2$ laser beam, an SPF formed with an arrangement of apertures having a pitch not larger than a half of a shortest wavelength of the laser beam applied by the driver laser is necessary.

BRIEF DESCRIPTION OF THE DRAWINGS

FIGS. 14A and 14B show amplitude lines of a $CO_2$ laser;

DESCRIPTION OF THE PREFERRED EMBODIMENTS

Figure 1:
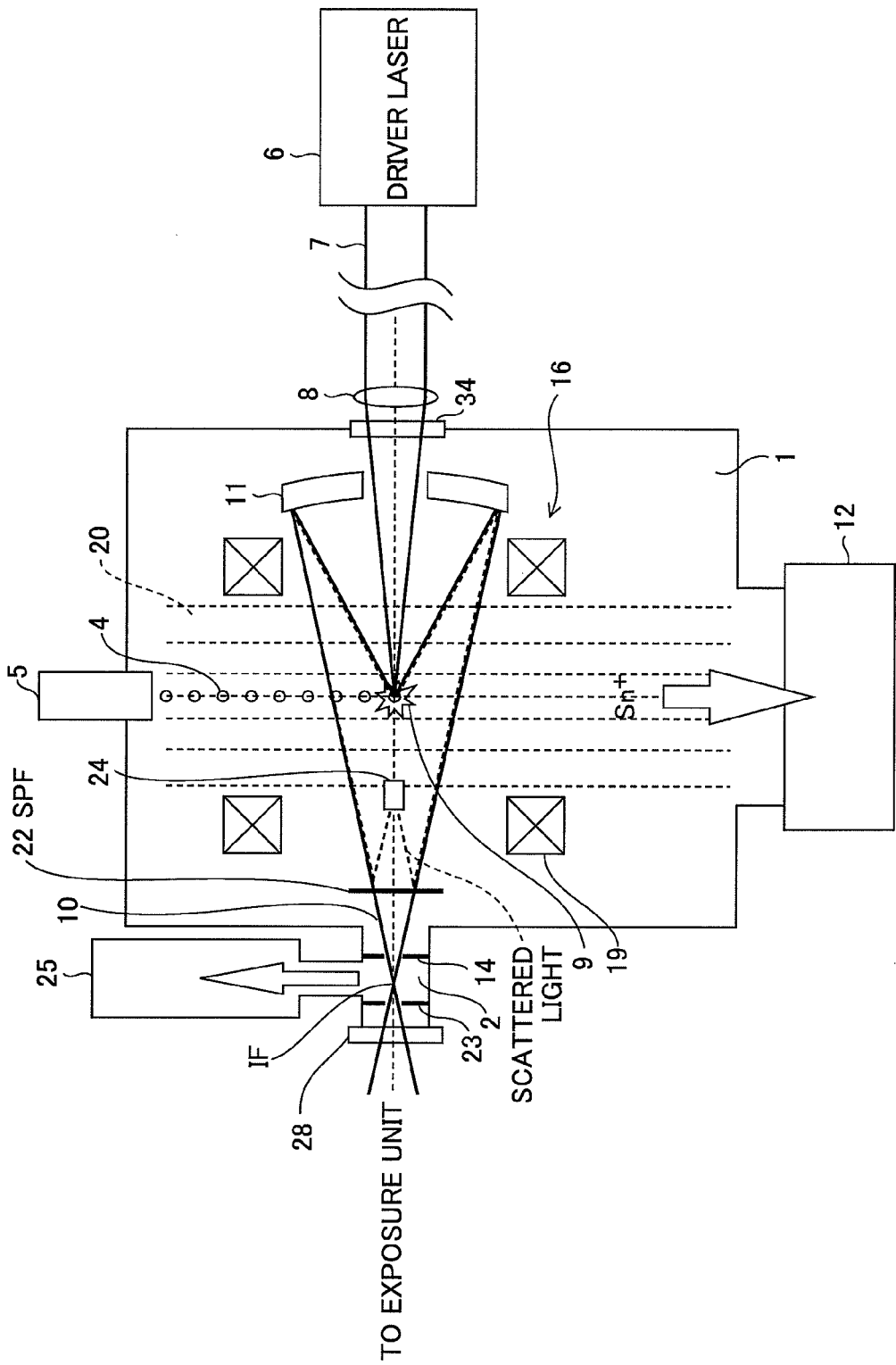
FIG. 1 shows a configuration of an extreme ultraviolet light source apparatus according to the first embodiment of the present invention.

Hereinafter, preferred embodiments of the present invention will be explained in detail by referring to the drawings. The same reference numerals are assigned to the same component elements and the description thereof will be omitted.
(First Embodiment)

FIG. 1 shows a configuration of an extreme ultraviolet (EUV) light source apparatus according to the first embodiment of the present invention. The EUV light source apparatus employs a laser produced plasma (LPP) type of generating EUV light by applying a laser beam to a target material for excitation.

As shown in FIG. 1, the EUV light source apparatus according to the embodiment includes a first vacuum chamber 1 in which EUV light is generated and a second vacuum chamber 2 for guiding the generated EUV light to an external exposure unit, and improves the quality of the generated EUV light 10 with a mesh-type spectrum purity filter (SPF) 22.

Further, the EUV light source apparatus includes a target supply unit 5 for supplying a target 4 to a predetermined position (beam focusing point 9) within the first vacuum chamber 1, a driver laser 6 provided outside of the first vacuum chamber 1, a laser beam focusing optics 8 including at least one lens and/or at least one mirror arranged outside and/or inside of the first vacuum chamber 1, for guiding and focusing an excitation laser beam 7 applied by the driver laser 6, an incident window 34 for introducing the excitation laser beam 7 into the first vacuum chamber 1, an EUV collector mirror 11 for reflecting and collecting the EUV light 10 radiated from plasma generated when the excitation laser beam 7 is applied to the target 4 at the beam focusing point 9, a first vacuum pump 12 for evacuating the first vacuum chamber 1, and a second vacuum pump 25 for evacuating the second vacuum chamber 2.

Furthermore, the EUV light source apparatus includes a first pinhole aperture (aperture part) 14 provided on a partition wall between the first vacuum chamber 1 and the second vacuum chamber 2, for connecting the first vacuum chamber 1 to the second vacuum chamber 2, and a second pinhole aperture (aperture part) 23 for guiding EUV light entering from the first pinhole aperture 14 to an exposure unit.

Furthermore, the EUV light source apparatus may include a mitigation unit 16 for protecting the EUV collector mirror 11 and so on from debris. The mitigation unit 16 may include a superconducting coil electromagnet 19 for generating lines of magnetic force 20 surrounding the plasma, for example.

Moreover, the EUV light source apparatus may include a valve for introducing an etchant gas for cleaning, and a gate valve 28 provided at the downstream of the second pinhole aperture 23, for preventing the etchant gas from flowing out into the exposure unit at cleaning.

The target supply unit 5 heats and dissolves solid tin (Sn) and supplies it in a solid state or liquid droplets as the target 4 into the first vacuum chamber 1. The target 4 passes through the beam focusing point 9 at which it intersects with the excitation laser beam 7.

The driver laser 6 is a high-power $CO_2$ pulse laser using a laser gas containing a carbon dioxide gas ($CO_2$) as a laser medium (e.g., the output: 20 kW, the pulse repetition frequency: 100 kHz, the pulse width: 20 ns). The excitation laser beam ($CO_2$ laser beam) 7 applied by the driver laser 6 is focused on the target 4 via the laser beam focusing optics 8 and the incident window 34 of the first vacuum chamber 1, excites the target 4 to turn it into plasma, and generates EUV light 10 (the center wavelength: 13.5 nm). The generated EUV light 10 is collected and outputted to an intermediate focus (IF) by the EUV collector mirror 11 having an ellipsoidal reflecting surface, and guided to the exposure unit. When the target 4 is excited, the $CO_2$ laser beam 7 applied by the driver laser 6 is reflected by the target 4 and scattered or reflected by the plasma generated at the beam focusing point 9, and reflected and collected by the EUV collector mirror 11 toward the IF.

The SPF 22 for blocking the $CO_2$ laser beam 7 is arranged between the IF and the EUV collector mirror 11, and transmits the EUV Light 10 having the center wavelength of 13.5 nm necessary for EUV exposure from among the light reflected by the EUV collector mirror 11. On the other hand, the SPF 22 reflects the $CO_2$ laser beam 7 and the reflected $CO_2$ laser beam 7 enters a water-cooling dumper 24 arranged on a reflection optical axis of the EUV collector mirror 11, and is absorbed and converted into heat.

Alternatively, the SPF 22 may be slightly tilted such that light having a long wavelength such as a $CO_2$ laser beam is reflected in a direction at an angle relative to the reflection optical axis of the EUV collector mirror 11, and the water-cooling dumper 24 may be arranged in a position not to block the EUV light 10 reflected by the EUV collector mirror 11.

The two pinhole apertures 14 and 23 are arranged at the upstream and downstream of the IF, and the degree of vacuum is made higher in the second vacuum chamber 2 between the two pinhole apertures 14 and 23 by the vacuum pump than that in the first vacuum chamber and in the space connecting to the exposure unit. The diameters of the apertures 14 and 23 are about several millimeters. The IF is provided in the second vacuum chamber 2 other than the first vacuum chamber 1. By this configuration, the target and debris within the first vacuum chamber 1 are prevented from flowing into the exposure unit according to the principle of differential evacuation.

In the embodiment, the superconducting coil electromagnet 19 for generating a magnetic field is used as the mitigation unit 16 for protecting the optical elements (the SPF 22, the EUV collector mirror 11, the laser beam focusing optics 8, the incident window 34, incident windows of an EUV light sensor and other optical sensors, and so on) within the first vacuum chamber 1 from the debris flying from the plasma at the beam focusing point 9.

Since Sn ions generated from the target plasma have charge, the ions are subjected to Lorentz force in the magnetic field, restrained by the lines of magnetic force, and ejected to the outside of the first vacuum chamber 1 by the vacuum pump 12.

On the other hand, neutral Sn particles other than the ions generated from the target plasma are not restrained by the magnetic field, and fly to the outside of the lines of magnetic force as Sn debris and gradually contaminate the optical elements.

In the embodiment, the probability that the debris passes through the pinhole aperture 14 is lowered by imposing a spatial restriction by the pinhole aperture 14, and the debris that has passed the pinhole aperture 14 is collected by a vacuum pump 25. Thus, the debris hardly flows into the exposure unit through the other pinhole aperture 23.

However, due to diffusion of neutral debris within the first vacuum chamber 1, the surface of the SPF 22 may be gradually contaminated by the debris and overheated. In this case, the SPF 22 may be cleaned by using the etchant gas under the condition that the operation of the EUV light source apparatus is temporarily stopped and the exposure unit is completely isolated from the first vacuum chamber 1 and the second vacuum chamber 2 by closing a gate valve 28 provided near the IF.

As the etchant gas, a hydrogen gas, halogen gas, hydrogen halide, argon gas, or mixed gas of them is used, and the cleaning may be promoted by heating the SPF 22 with a heating unit (not shown). Further, the cleaning may be promoted by exciting the etchant gas with RF (radio frequency) waves or microwaves.

When the cleaning is finished, the supply of the etchant gas is stopped. After confirming that the degree of vacuum in the second vacuum chamber 2 is made lower enough by the vacuum pump 25, the gate valve 28 is opened and the operation of the EUV light source apparatus is restarted.

By the above-mentioned mitigation unit 16 using the magnetic field, the surface of the SPF 22 can be effectively prevented from being sputtered by the Sn ions. However, the neutral Sn debris is deposited on the SPF 22, and thereby, the reflectance of the $CO_2$ laser beam in the SPF 22 is gradually reduced with the operation, and the SPF 22 absorbs light and the temperature rises. In the embodiment, by observation of the temperature distribution of the SPF 22 with a thermoviewer, and when sensing that the temperature rise is greater than a threshold level due to adherence of the neutral Sn debris, the apparatus may be stopped for replacement or the above-mentioned cleaning of the SPF 22.

Figure 2:
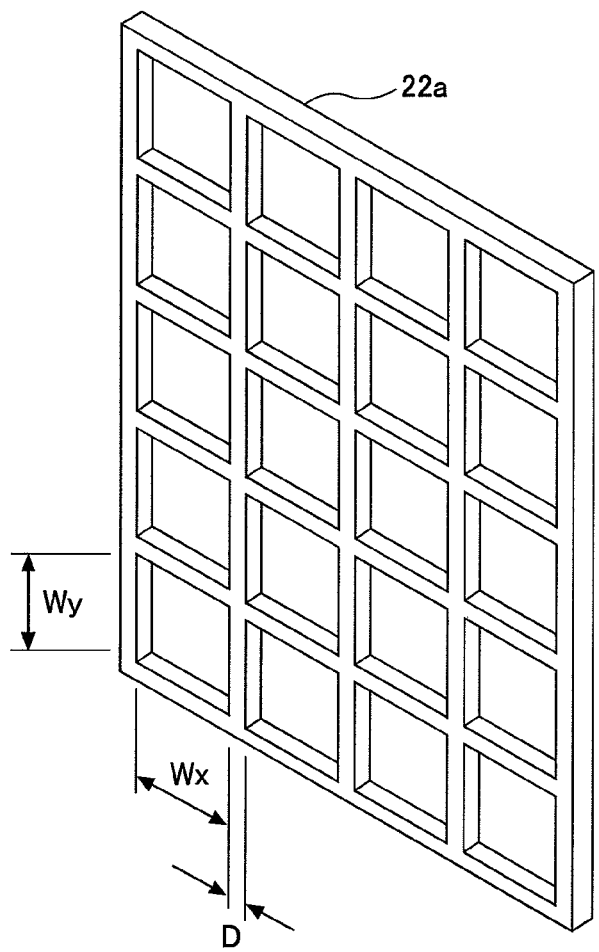
FIG. 2 is a perspective view showing a first example of an SPF used in the extreme ultraviolet light source apparatus according to the first embodiment of the present invention.

FIG. 2 is a perspective view showing a first example of the SPF used in the extreme ultraviolet light source apparatus according to the first embodiment. The SPF includes a mesh 22a in which an arrangement of apertures having a predetermined pitch is formed. In the first example, the mesh 22a has a square-lattice form. The mesh 22a may be manufactured by arranging plural wires laterally and longitudinally, or manufactured by forming plural apertures on a substrate to remain frames, for example.

Here, assuming that each wire or frame has a diameter D and each aperture has a lateral width Wx and a vertical width Wy, each of the lateral pitch (Wx+D) and the vertical pitch (Wy+D) is made equal to or less than a half of a wavelength of an incident electromagnetic wave, that is, a $CO_2$ laser beam in the embodiment. For example, by making each of the lateral pitch and the vertical pitch equal to or less than 5 μm, the $CO_2$ laser beam having a wavelength of 10.6 μm is blocked, and transmittance becomes about 1/1000, and thus, the $CO_2$ laser beam is prevented from passing therethough.

On the other hand, the EUV light having a center wavelength of 13.5 nm is transmitted through the SPF 22 according to the aperture ratio of the mesh. The aperture ratio E (%) is calculated by the following equation.

$$E = 100 \times (Wx \times Wy)/((Wx+D) \times (Wy+D))$$

For example, given that each of the lateral width Wx and the vertical width Wy of the aperture is 4.5 μm and the diameter D of the wire or frame is 0.5 μm, the aperture ratio E is 81%. In practice, the mesh acts on the EUV light as a diffraction grating, and the transmittance is further reduced in consideration of diffraction loss.

Figure 3:
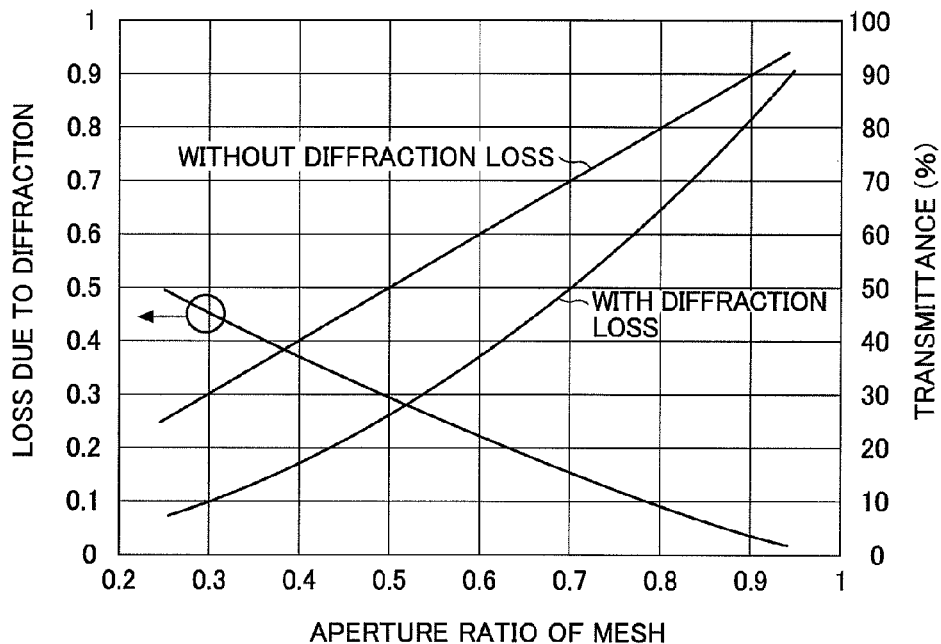
FIG. 3 shows changes of diffraction loss and transmittance relative to an aperture ratio of a mesh in the SPF shown in FIG. 2.
Figure 4:
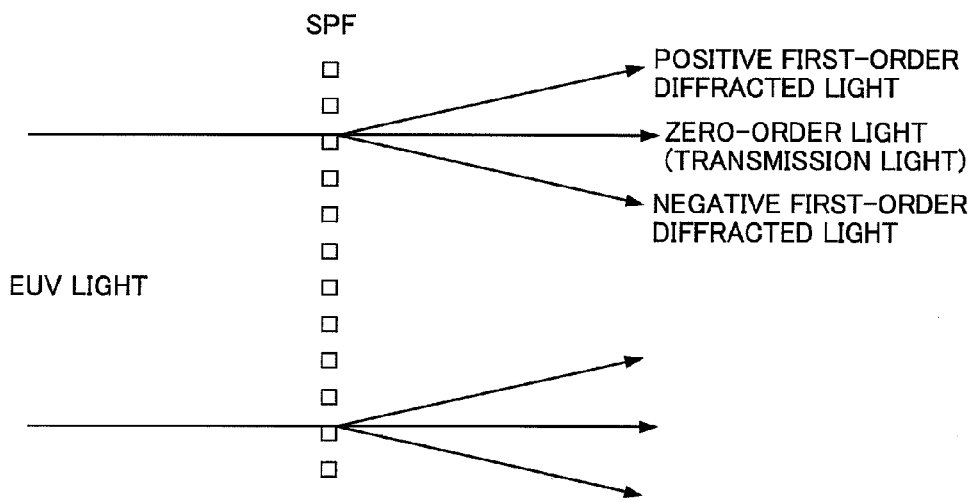
FIG. 4 is a diagram for explanation of diffracted light generated on the surface of the SPF shown in FIG. 2.

FIGS. 3 and 4 are diagrams for explanation of relationships between the aperture of the mesh shown in FIG. 2 and the transmittance of the EUV light. FIG. 3 shows changes of diffraction loss and transmittance relative to the aperture ratio of the mesh, and FIG. 4 is a diagram for explanation of the diffracted light generated on the surface of the SPF. When the first or higher order of diffracted light as shown in FIG. 4 is calculated as loss, there is a relationship between the aperture ratio and the transmittance as shown in FIG. 3. FIG. 3 also shows the transmittance without diffraction loss. In consideration of diffraction loss in the mesh having an aperture ratio of 81%, the transmittance is about 66%. Further, from FIG. 3, it is known that the mesh having a high aperture ratio, for example, equal to or larger than 80% is desirable for reducing the diffraction loss.

Referring to FIG. 1 again, in order to minimize the loss of the EUV light toward the exposure unit, it is required that the position of the SPF 22 is made closer to the position of the IF such that the diffracted light is also used in the exposure unit. When the position of the SPF 22 is made closer to the IF, energy density of the EUV light entering the SPF 22 becomes greater, and it is required that no structural deformation or breakage occurs even when the SPF 22 absorbs light having great energy density and its temperature rises.

Figure 5:
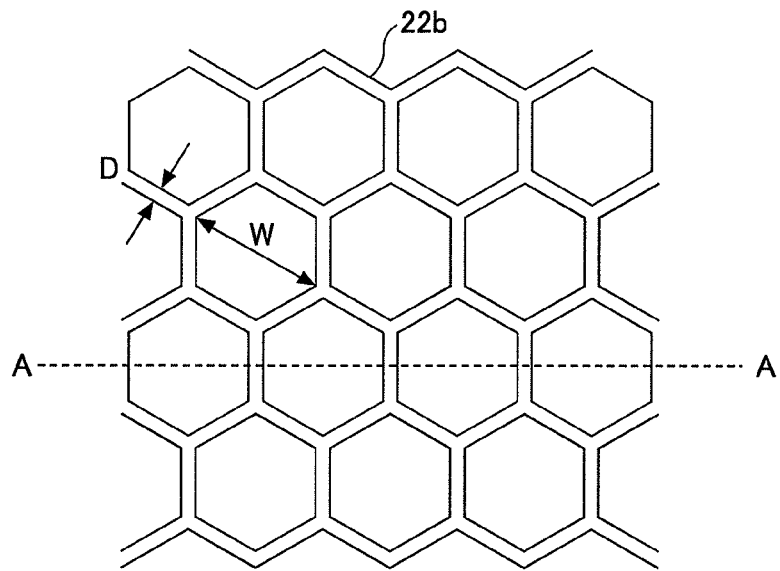
FIG. 5 is a plan view showing a second example of the SPF used in the extreme ultraviolet light source apparatus according to the first embodiment.
Figure 6:
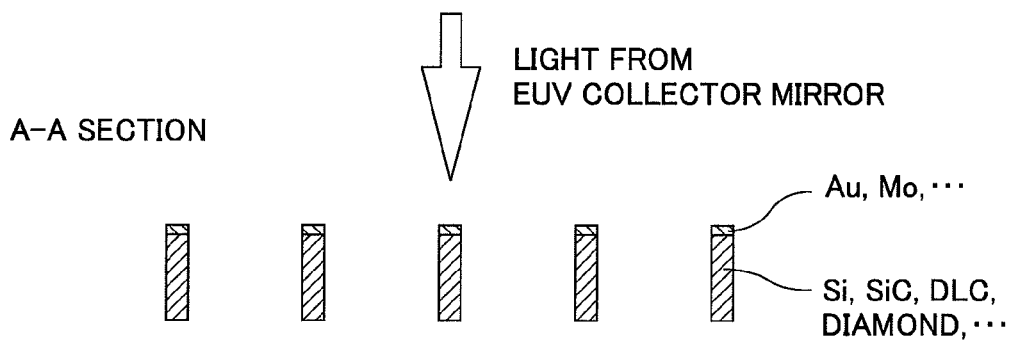
FIG. 6 is a sectional view along A-A in FIG. 5.

FIG. 5 is a plan view showing a second example of the SPF used in the extreme ultraviolet light source apparatus according to the first embodiment. Further, FIG. 6 is a sectional view along A-A in FIG. 5. The SPF includes a mesh 22b in which an arrangement of apertures having a predetermined pitch is formed. In the second example, the mesh 22b has a honeycomb form. The mesh 22b may be manufactured by consecutively arranging plural frames each having a regular hexagon shape, or forming plural apertures on a substrate, for example. In the second example, an arrangement of apertures has a pitch (W+D) at maximum, and the pitch is made equal to or less than 5 μm.

The SPF shown in FIG. 5 includes the honeycomb mesh 22b more adapted to the above-mentioned requirements, and realizes a high aperture ratio and high EUV light transmittance while maintaining the mechanical strength of the mesh. There are advantages that the honeycomb structure is a strong and hardly deformed structure obtained by arranging regular hexagons without gaps, an amount of a material necessary for manufacture can be made small, the diameter D of the frames forming the hexagons can be made small, and the aperture ration can be taken larger, and so on.

In the embodiment, the material of the mesh is a material having a high coefficient of thermal conductivity and high rigidity such as silicon (Si), silicon carbide (SiC), diamond-like carbon (DLC), diamond, or the like, and maintains the mechanical strength of the SPF. A metal coating of gold (Au), molybdenum (Mo), or the like is provided to at least the light incident surface of the mesh, improves the reflectance of the $CO_2$ laser beam, reduces the absorption of the $CO_2$ laser beam in the SPF, and reduces the thermal deformation and breakage of the SPF. Further, since the mesh is manufactured by using a material having a high coefficient of thermal conductivity, the heat can be efficiently removed via a holder for holding the periphery of the mesh, and the thermal deformation and breakage of the SPF can be further reduced.

Figure 7:
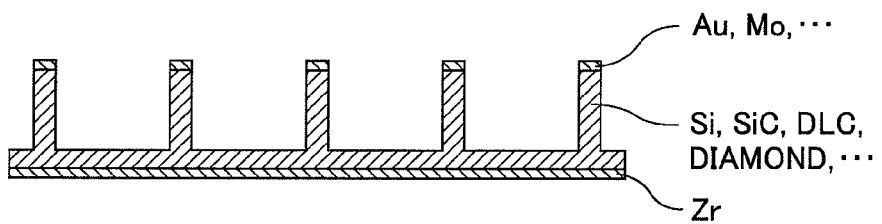
FIG. 7 is a sectional view showing a third example of the SPF used in the extreme ultraviolet light source apparatus according to the first embodiment.

FIG. 7 is a sectional view showing a third example of the SPF used in the extreme ultraviolet light source apparatus according to the first embodiment. In the SPF, a substrate made of the same material as that of the mesh is arranged on a light exit surface of the mesh. In order to fabricate such a structure, for example, a silicon (Si) substrate is etched by using an etching device to be used in the semiconductor manufacturing process, and thereby, the substrate and the mesh are integrally fabricated.

A metal coating of gold (Au), molybdenum (Mo), or the like is applied on at least the light incident surface of the mesh, and thereby, improves the reflectance of the $CO_2$ laser beam, reduces the absorption of the $CO_2$ laser beam in the SPF, and reduces the thermal deformation and breakage of the SPF.

Although examples are shown in FIGS. 6 and 7, in which a metal coating of gold (Au), molybdenum (Mo), or the like is provided on the light incident surface of the mesh so as to efficiently reflect the $CO_2$ laser beam, the present invention is not limited to these examples. As far as the mesh has electrical conductivity, it is possible to reflect an electromagnetic wave or light having a wavelength equal to or larger than twice a pitch of the mesh. Specifically, the mesh itself may be formed of a material having electrical conductivity, or a material having electrical conductivity may be coated on the light incident surface, a back, or a sidewall of the mesh.

Further, the thickness of the silicon substrate is made as thin as about 150 nm and the rear surface of the silicon substrate is coated with zirconium (Zr), and thereby, the substrate part also has the optical characteristic of the conventional thin film filter type SPF and can suppress transmission of not only the $CO_2$ laser beam but also other unwanted spectra.

Furthermore, the mesh reinforces the substrate in strength, and has greater mechanical strength than the conventional thin film filter type SPF, and hard to be broken. As the material of the substrate and the mesh, a material having high transmittance for EUV light and great mechanical strength such as silicon carbide (SiC), diamond-like carbon (DLC), diamond, or the like may be employed as well as silicon.

When the material of the substrate and the mesh has high hardness and a high coefficient of thermal conductivity like diamond or the like, the substrate and mesh can be made thinner while the mechanical strength is held, and thereby, the aperture ratio is greater and the transmittance for EUV light is higher, and the efficiency of the light source can be improved.

Furthermore, since the coefficient of thermal conductivity is great, the light energy absorbed by the substrate and the mesh can be efficiently removed and the risk of the deformation and breakage can be reduced.

Figure 8:
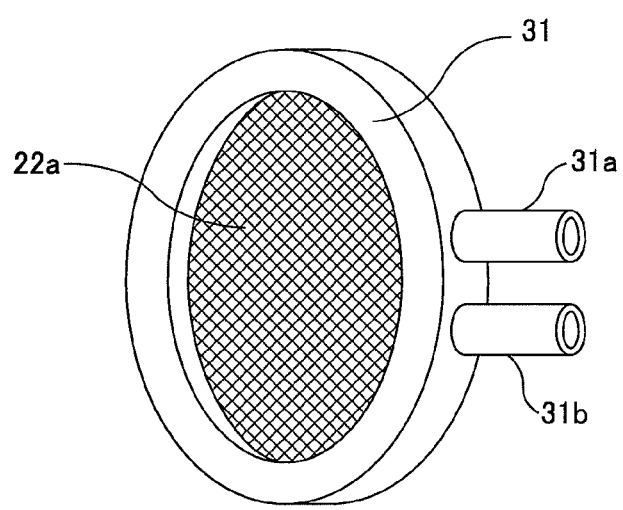
FIG. 8 is a perspective view showing of the SPF including a holder used in the extreme ultraviolet light source apparatus according to the first embodiment.

FIG. 8 is a perspective view showing an SPF including a holder. In FIG. 8, the case of using the mesh 22a is shown, however, the mesh 22b may be also used. The mesh 22a of the SPF 22 is thin and flexible, and therefore, unable to autonomously hold its position. Accordingly, by holding the periphery of the mesh 22a with the holder 31 such that the surface of the mesh 22a is flat, adequate surface tension is obtained, and the mesh 22a is provided within the first vacuum chamber 1 as a film-like element under tension.

The holder 31 of the SPF 22 is made of a metal having a high coefficient of thermal conductivity such as copper, and has a structure in which a channel for passing a medium (water or the like) for cooling or heating the mesh is formed. FIG. 8 shows an inlet 31a and an outlet 31c of the channel. Since the mesh 22a of the SPF 22 is formed of a material having a high coefficient of thermal conductivity, the heat generated in the mesh 22a can be efficiently removed via the holder 31 for holding the periphery of the mesh 22a. Therefore, by using the holder 31, the thermal deformation and breakage of the SPF 22 can be prevented. Further, when the SPF 22 is cleaned with an etchant gas or the like, the mesh 22a may be heated via the holder 31 for promotion of chemical reaction for cleaning.

Figure 9:
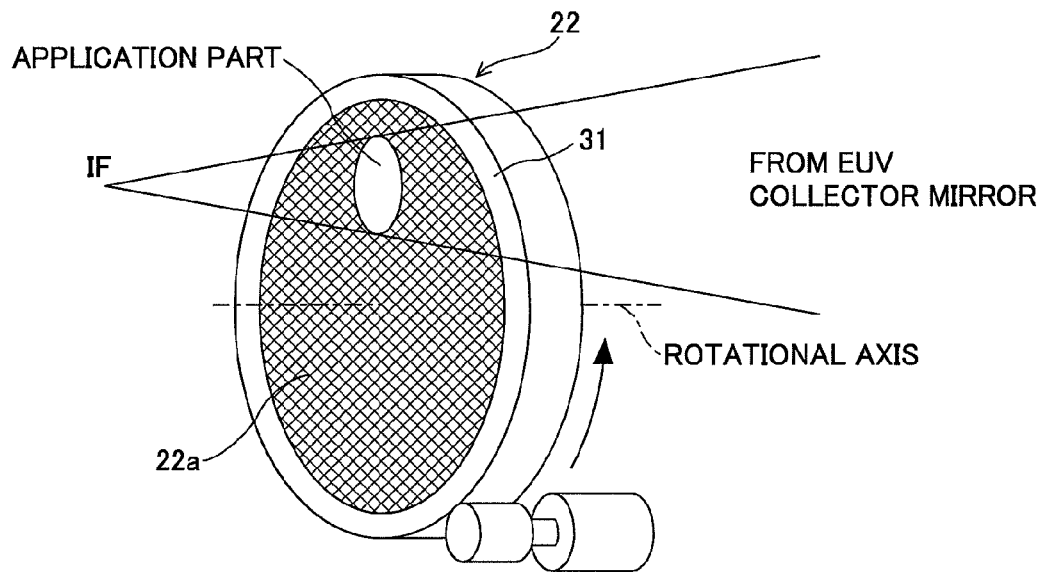
FIG. 9 is a conceptual diagram for explanation of a rotation mechanism of the holder of the SPF used in the extreme ultraviolet light source apparatus according to the first embodiment.
Figure 10:
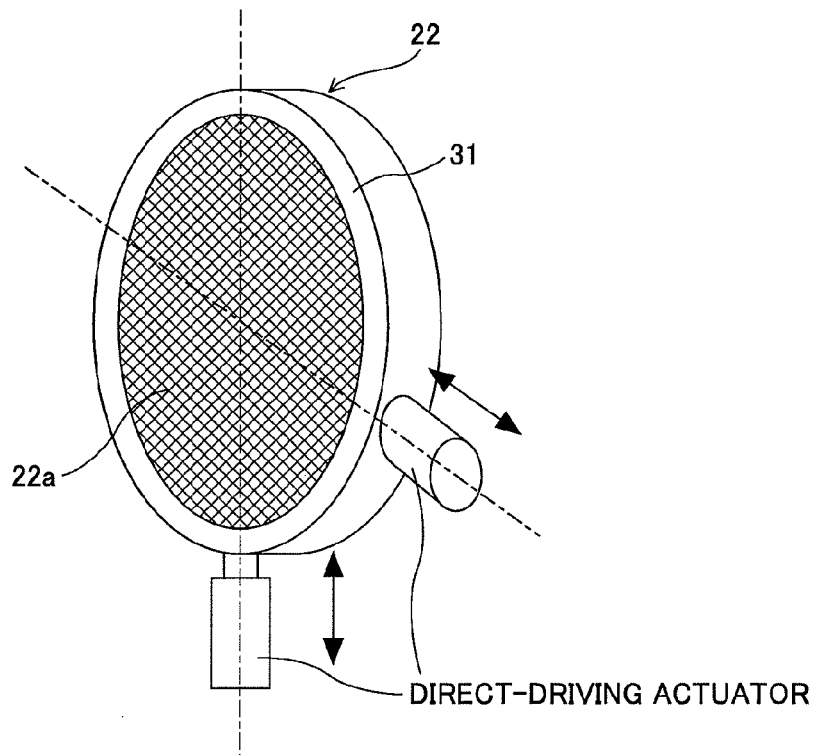
FIG. 10 is a conceptual diagram for explanation of a vibration mechanism of the holder of the SPF used in the extreme ultraviolet light source apparatus according to the first embodiment.

FIGS. 9 and 10 are conceptual diagrams for explanation of a mechanism of rotating or vibrating the holder of the SPF.

FIG. 9 shows a mechanism for rotating the holder 31 with a motor or the like. By rotating the SPF 22, the variations in the part of the SPF 22, to which EUV light is applied, are averaged, and the fine intensity distribution of transmitted EUV light caused by transmittance variations of the SPF 22 is solved by time integration, and thereby, exposure variations can be improved. The holder 31 may be rotated by an ultrasonic motor as disclosed in Japanese Patent Application Publication JP-A-7-184382, which is incorporated herein by reference.

According to the technique of rotating the SPF, the location, where the $CO_2$ laser beam reflected or diffused by the target is applied, changes with the rotation, and thereby, the heat generated in the SPF 22 can be efficiently diffused and the life of the SPF 22 can be extended.

Further, FIG. 10 shows a direct-driving actuator including a piezoelectric element or the like. By providing vibration to the SPF 22, the fine intensity distribution of transmitted EUV light generated by the SPF 22 is solved by time integration, and thereby, exposure variations can be improved.

(Second Embodiment)

Figure 11:
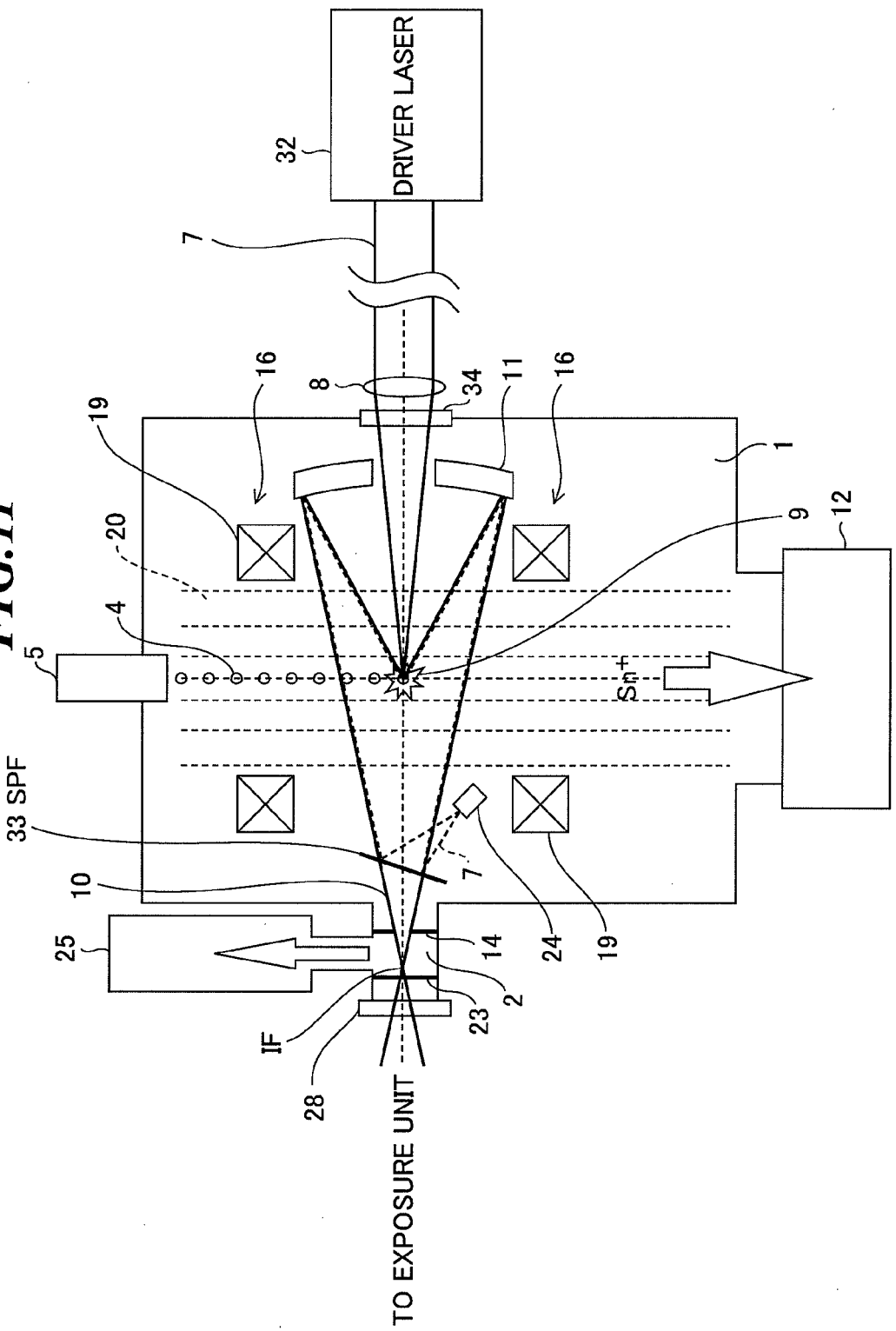
FIG. 11 shows a configuration of an extreme ultraviolet light source apparatus according to the second embodiment of the present invention.

FIG. 11 shows a configuration of an extreme ultraviolet light source apparatus according to the second embodiment of the present invention. In the second embodiment, a driver laser 32 uses a laser gas containing a carbon dioxide ($CO_2$) gas as a laser medium and radiates an excitation laser beam ($CO_2$ laser beam) having linear polarization, and a wire grid polarizer is used in place of the mesh in a spectrum purity filter (SPF) 33. The rest of the configuration is the same as that in the first embodiment.

Figure 12:
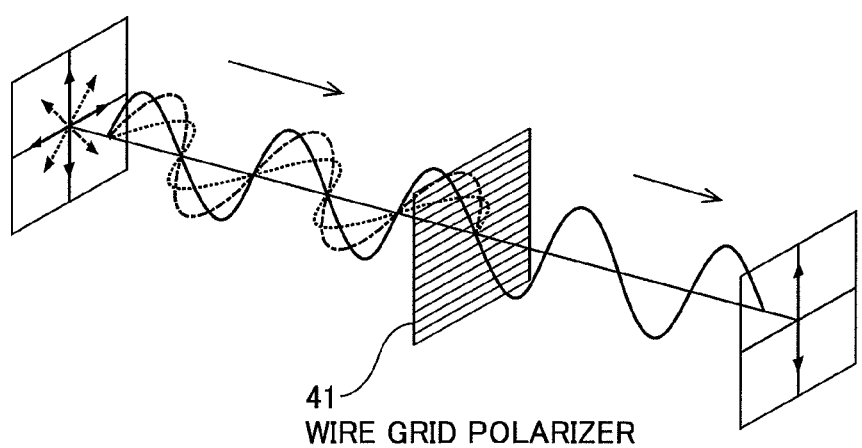
FIG. 12 is a principle diagram for explanation of a polarization direction of a $CO_2$ laser beam and a wire grid polarizer in the second embodiment.

FIG. 12 is a principle diagram for explanation of the polarization direction of the $CO_2$ laser beam and the wire grid polarizer. The wire grid polarizer 41 has periodically arranged wires of a metal or the like, and the wire spacing is made equal to or less than a half of a wavelength of an incident electromagnetic waves, that is, the $CO_2$ laser beam in the embodiment.

As shown in FIG. 12, the wire grid polarizer 41 has transmittance that changes according to the polarization direction of the incident electromagnetic waves. In the case where the pitch of the wires is equal to or less than 5 μm, the wire grid polarizer 41 reflects and blocks the $CO_2$ laser beam at high reflectance when the electric field vibration direction in the $CO_2$ laser beam having the linear polarization and the extending direction of the wires are substantially the same.

Accordingly, in FIG. 11, by determining the polarization direction of the excitation laser beam 7 applied by the driver laser 32 and the direction of the wire grid in the SPF 33 as described above, the SPF 33 can reflect the $CO_2$ laser beam reflected by the target and suppress the $CO_2$ laser beam from entering the exposure unit. On the other hand, the EUV light has transmittance and diffraction loss according to the aperture ratio similarly to the mesh in the first embodiment.

The difference from the mesh is that the wires are only in one direction in the wire grid polarizer. The substantial aperture ratio E (%) is expressed by the following equation.

$$E = 100 \times W/(W+D)$$

Therefore, when the diameter D and the aperture width W of the wires are made the same as those in the mesh type, the higher aperture ratio, i.e., the higher EUV transmittance than that of the mesh type can be expected.

The light component of the reflected $CO_2$ laser beam and so on enters the dumper 24 and is absorbed. In FIG. 11, the dumper 24 is arranged off the optical axis, however, it may be arranged on the optical axis as shown in FIG. 1.

When it is difficult to obtain the linear polarized $CO_2$ laser beam, by arranging two wire grid polarizers overlapping such that the extending directions of the respective wires are orthogonal to each other, the $CO_2$ laser beam can be blocked as is the case of the mesh. The $CO_2$ laser beam becomes linear polarized light having a polarization plane in a direction orthogonal to the direction of the extending direction of the wires after transmitted through the first wire grid polarizer, and thus, the $CO_2$ laser beam is unable to pass through the second wire grid polarizer provided orthogonally to the first wire grid polarizer. In this way, the $CO_2$ laser beam applied by the driver laser 6 can be efficiently blocked regardless of its polarization state.

In this case, the difference from the case of one wire grid polarizer is that the heat load per one polarizer due to light absorption is reduced to half and thermal deformation and breakage becomes less because the light is reflected and absorbed by the two wire grid polarizers.

These wire grid polarizers are fabricated of a material having a high coefficient of thermal conductivity and high rigidity such as silicon (Si), silicon carbide (SiC), diamond-like carbon (DLC), diamond, or the like similarly to the mesh in the first embodiment such that the mechanical strength of the SPF 33 is maintained. Further, a metal coating of gold (Au), molybdenum (Mo), or the like is provided to at least the light incident surface of the wire grid polarizer such that the reflectance of the $CO_2$ laser beam is improved, the absorption of the $CO_2$ laser beam by the SPF 33 is reduced, and the thermal deformation and breakage of the SPF 33 are reduced.

Further, since the wires of the wire grid polarizer are made of a material having a high coefficient of thermal conductivity, as is the case of the SPF 22 in the first embodiment as shown in FIG. 8, by providing the holder 31 (FIG. 8) for holding the periphery of the wire grid polarizer such that the surface of the wire grid polarizer is flat, the heat can be efficiently removed via the holder, and the thermal deformation and breakage of the SPF 33 can be further reduced.

In the first and second embodiments, the SPF 22 or SPF 33 is provided between the EUV collector mirror 11 and the IF, however, the same effect can be obtained even when the SPF is provided in an arbitrary location in an optical path of the EUV light 10 such as a space of the exposure unit side at the downstream of the IF in the passage of the EUV light 10.

(Third Embodiment)

Figure 13:
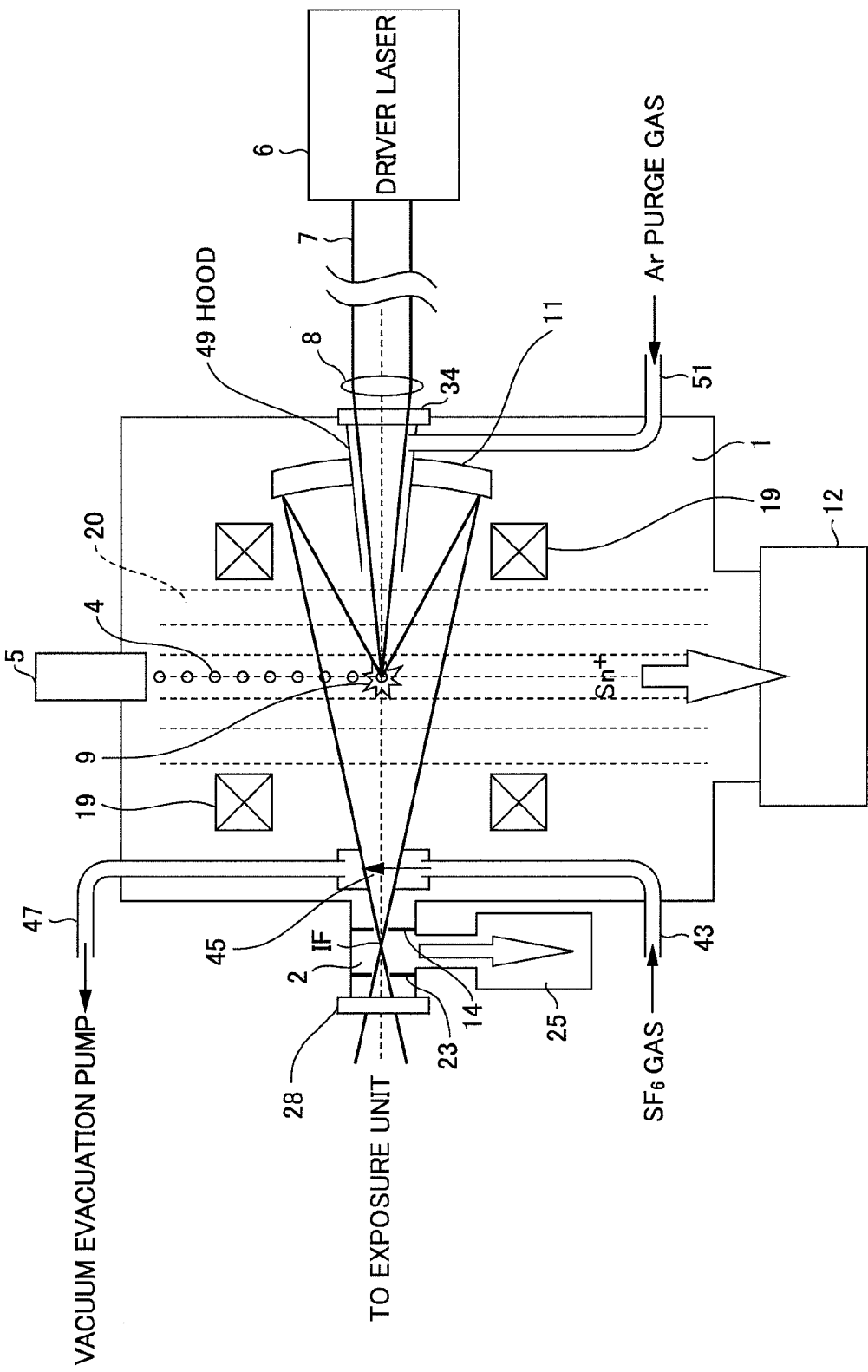
FIG. 13 shows a configuration of an extreme ultraviolet light source apparatus according to the third embodiment of the present invention.

FIG. 13 shows a configuration of an extreme ultraviolet light source apparatus according to the third embodiment of the present invention. In the embodiment, an SPF of gas absorption type specialized for blocking the $CO_2$ laser beam is used and sulfur hexafluoride ($SF_6$) gas is used as a gas for absorption. The rest of the configuration is the same as that in the first embodiment.

In the embodiment, a gas introducing nozzle 43 and a gas discharging nozzle 47 are provided to face each other near the IF within the first vacuum chamber 1. The $SF_6$ gas is introduced near the IF within the first vacuum chamber 1 via the gas introducing nozzle 43 and the $SF_6$ gas is collected into the gas discharging nozzle 47 by using a vacuum evacuation pump, and thereby, a gas curtain 45 of $SF_6$ is generated. The sulfur hexafluoride ($SF_6$) gas has a property of specifically absorbing the $CO_2$ laser beam having a wavelength of 10.6 μm, and absorbs and blocks the $CO_2$ laser beam of the light focused toward the IF.

The technology of the gas curtain is disclosed in JP-P2007-129209A. However, nothing about the use of $SF_6$ gas in the apparatus using the $CO_2$ laser beam is described. The $SF_6$ gas has nonlinear absorption rate for the $CO_2$ laser beam, and the absorption rate is high when the light energy density intensity is low and the absorption rate becomes lower as the light energy density intensity becomes higher. When the $SF_6$ gas is used as the SPF of gas absorption type, absorption is less in the focused part of the $CO_2$ laser beam in which the energy density intensity is very high for excitation of the plasma for generating the EUV light, however, it is possible to effectively absorb the $CO_2$ laser beam reflected or scattered by the target or the like and having low energy density intensity. Therefore, the $CO_2$ laser beam reflected or scattered by the target or the like can be efficiently absorbed and blocked while the energy for excitation of the plasma for generating the EUV light is maintained.

Further, the region, where the $CO_2$ laser beam for excitation of the plasma for generating the EUV light is focused, is partially covered by a hood 49 and the space within the hood is purged with argon (Ar) gas introduced from a purge nozzle 51, and thereby, the concentration of the $SF_6$ gas in the region, where the $CO_2$ laser beam is focused, is reduced, and the absorption of the $CO_2$ laser beam can be further reduced. Although argon (Ar) gas is used as a purge gas in this example, the present invention is not limited to this example, and a buffer gas such as hydrogen ($H_2$) gas or helium (He) gas can be used as the purge gas.

The above-mentioned $SF_6$ gas and Ar gas are ejected by three vacuum evacuation pumps. Here, it is necessary to maintain the concentration of the gas within the first vacuum chamber 1 equal to or less than 1 Torr, for example, such that the gas within the first vacuum chamber 1 can sufficiently transmit the EUV light.

In the third embodiment, as is the cases of the first and second embodiments, the two pinhole apertures 14 and 23 are arranged at the upstream and downstream of the IF and the space between the apertures is used as the second vacuum chamber 2, and the respective parts are formed such that the IF is located within the second vacuum chamber 2. The degree of vacuum is made higher in the second vacuum chamber 2 by the vacuum pump 25, and thereby, the debris generated in the first vacuum chamber 1 and the $SF_6$ gas can be ejected from the second vacuum chamber 2 and prevented from entering the exposure unit.

Fourth Embodiment

In the fourth embodiment, a $CO_2$ laser system for performing multiline amplification is used as the driver laser of the EUV light source apparatus. Other configuration is the same as that in the first to third embodiments.

FIGS. 14A and 14B show amplitude lines of a $CO_2$ laser. In each of a band of transition 00°1-10°0 as shown in FIG. 14A and a band of transition 00°1-02°0 as shown in FIG. 14B, there exist plural amplification lines (see C. K. N. Patel, "Continuous-Wave Laser Action on Vibrational Transition of $CO_2$", American Physical Society, Vol. 135(5A), A1187-A1193, November 1964).

A general $CO_2$ gas laser performs laser oscillation at only an amplification line P (20) with a wavelength of 10.6 μm. The reason is that a gain at the amplification line P(20) in the band of transition 00°1-10°0 is the most significant even when compared with those at other amplification lines, and energy is concentrated to the amplification line P(20).

However, in order to generate plasma for radiating EUV light, a laser beam having a short pulse width of about 20 ns to 50 ns is necessary. In order to efficiently amplitude the laser beam having such a short pulse width, it is known that the multiline amplification type of amplifying the laser beam at plural amplification lines is suitable.

In the case of performing the multiline amplification, seed light having wavelengths at amplification lines P(20), P(18), P(16) in the band of transition 00°1-10°0 and an amplification line P(22) in the band of transition 00°1-02°0 can be amplified by being passed through a $CO_2$ laser gas as a laser medium. Here, a wavelength at the amplification line P(22) in the band of transition 00°1-02°0 is about 9.56 μm.

Therefore, in the case of using the amplification line in the band of transition 00°1-02°0, even if an arrangement of apertures having a pitch of, for example, 5.3 μm, which is equal to or less than a half of a wavelength of the general $CO_2$ laser beam (10.6 μm), is formed in the SPF, a $CO_2$ laser beam having a wavelength of 9.56 μm is transmitted without being reflected. In order to reflect the $CO_2$ laser beam having a wavelength of 9.56 μm, the SPF formed with an arrangement of apertures having a pitch equal to or less than a half of the shortest wavelength among wavelengths of a laser beam applied by the driver laser is necessary.

Figure 15:
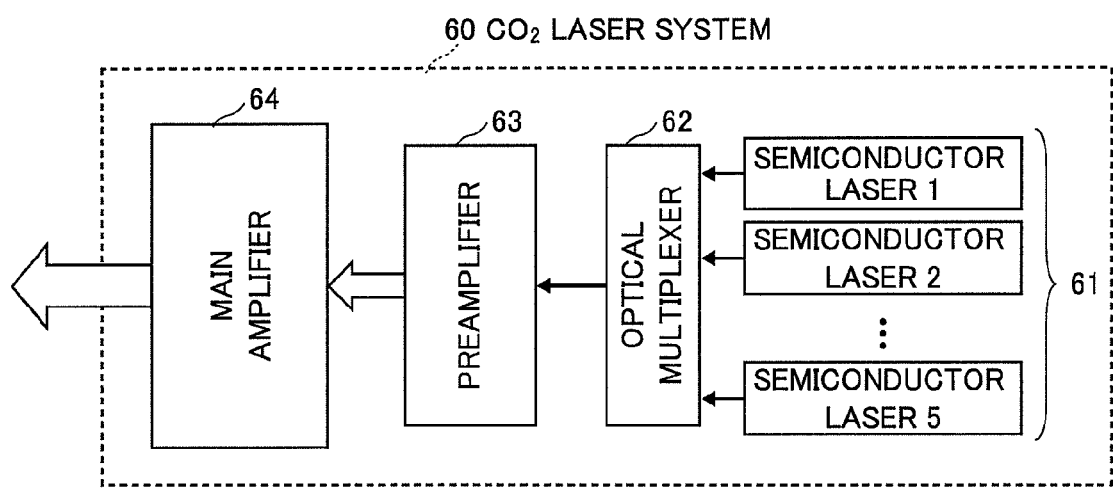
FIG. 15 shows a configuration of a $CO_2$ laser system for performing multiline amplification.

FIG. 15 shows a configuration of a $CO_2$ laser system for performing multiline amplification at desired amplification lines. Plural semiconductor lasers for performing pulse oscillation in a single longitudinal mode in correspondence with wavelengths at plural amplification lines in a $CO_2$ gas laser are used as master oscillators, and thereby, the multiline amplification can be realized.

The $CO_2$ laser system 60 includes plural semiconductor lasers 61, an optical multiplexer 62 for combining seed pulse light outputted from the plural semiconductor lasers 61, a preamplifier 63 for pre-amplifying the combined seed pulse light, and a main amplifier 64 for further amplifying the laser light pre-amplified by the preamplifier 63. Here, the preamplifier 63 and the main amplifier 64 use a laser gas containing a carbon dioxide gas ($CO_2$) as a laser medium. By passing the seed pulse light at multi-lines through the laser medium, pulse amplification at multi-lines can be realized. The concrete example will be explained as follows.

Figure 16A:
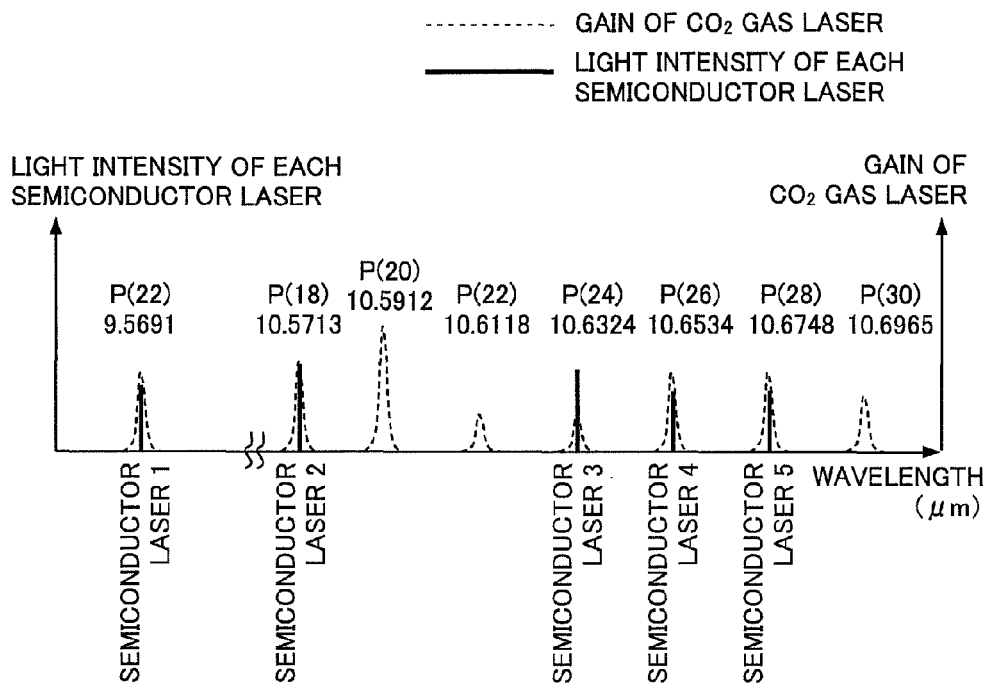
FIGS. 16A and 16B show intensity distribution in the case where intensity of wavelength components included in a laser beam outputted from a main amplifier is made uniform by adjusting light intensity in a longitudinal mode in oscillation of plural semiconductor lasers in correspondence with amplification ranges having different amplification gains.
Figure 16B:
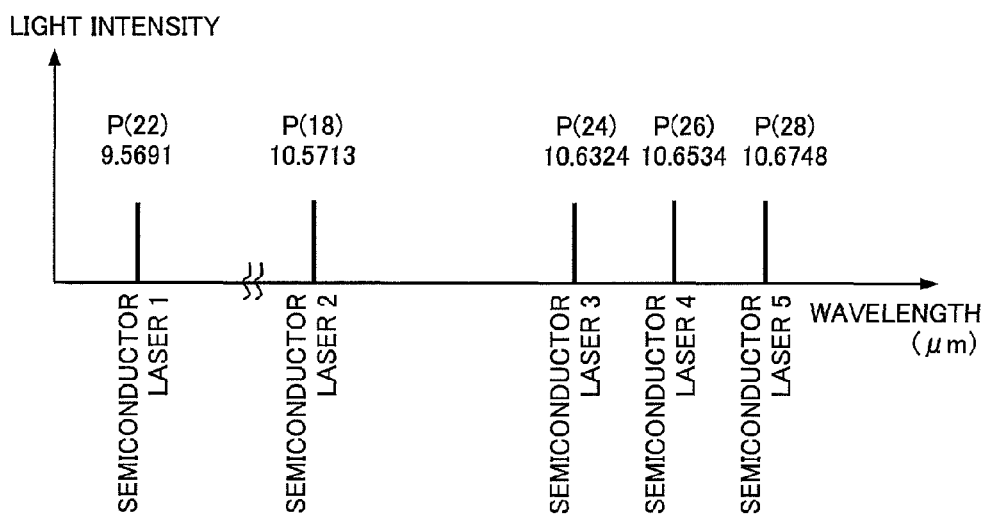
Figure 17:
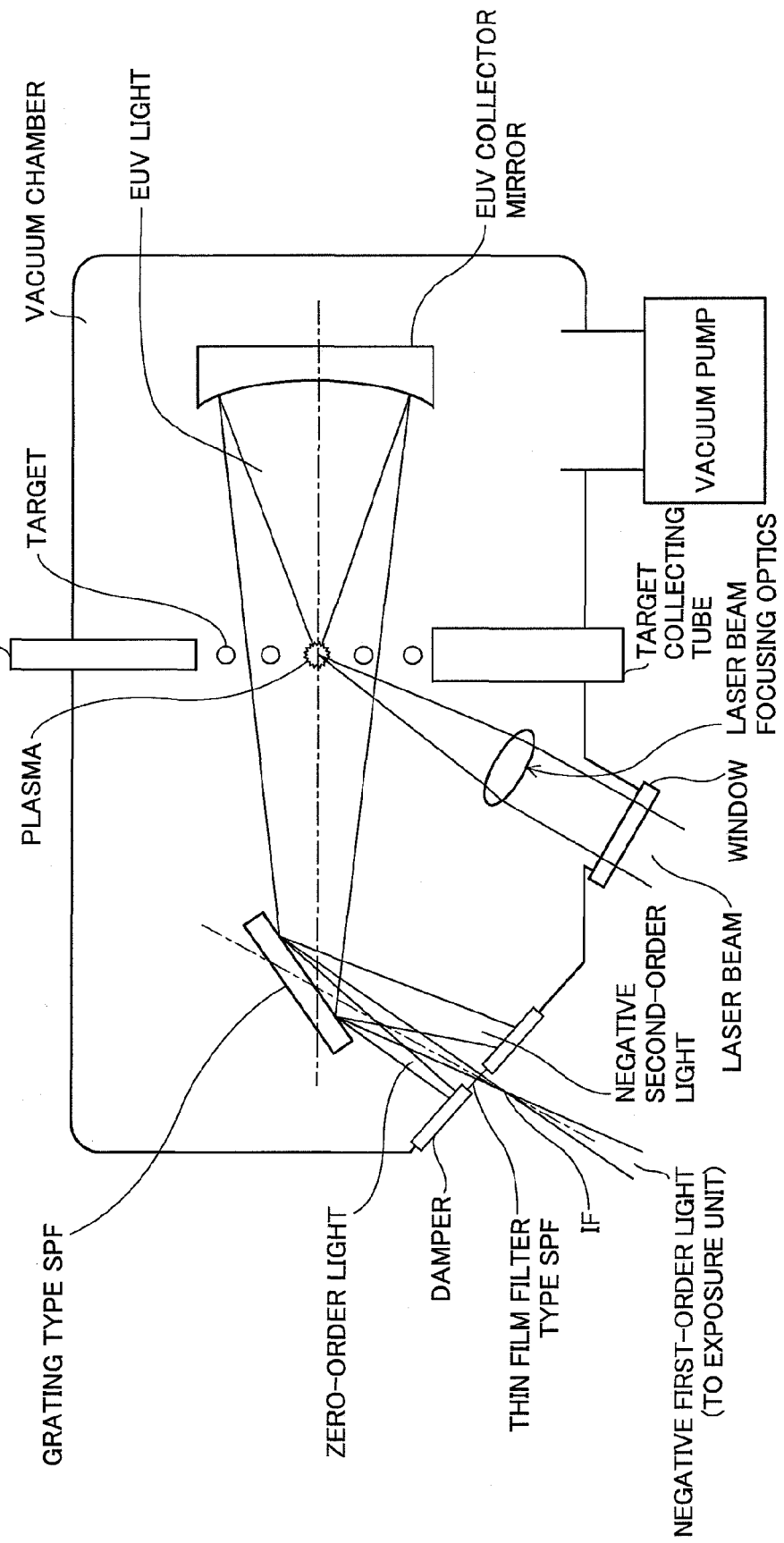
FIG. 17 shows a configuration example of a conventional LPP type EUV light source apparatus.

FIGS. 16A and 16B show intensity distribution in the case where intensity of wavelength components included in a laser beam outputted from a main amplifier is made uniform by adjusting light intensity in a longitudinal mode in oscillation of plural semiconductor lasers in correspondence with amplification ranges having different amplification gains.

FIG. 16A shows a relationship between the amplification gains of a $CO_2$ gas laser and light intensity of each semiconductor laser in the single longitudinal mode. For example, laser beams having five kinds of wavelengths outputted from five semiconductor lasers 1-5 are assigned to an amplification line P(22) in the band of transition 00°1-02°0 and amplification lines P(18), P(24), P(26), P(28) in the band of transition 00°1-10°0, respectively. Since gains are different among those amplification lines, intensity and wavelength of each semiconductor laser is adjusted in agree with the gain at respective one of the amplification lines.

Specifically, intensity of the semiconductor laserbeam, which is assigned to an amplification line with a large gain, is set small, while intensity of the semiconductor laser beam, which is assigned to an amplification line with a small gain, is set large. Thereby, as shown in FIG. 16B, it becomes possible that light intensity of plural lines is made substantially uniform. As a result, the amplification efficiency is improved in comparison with that in a single-line amplification. Although the multiline amplification in a $CO_2$ laser is simply explained in a schematic manner in this embodiment, a regenerative amplifier may be used according to need, in order to efficiently amplify seed pulse light having small light intensity after semiconductor laser beams are combined. Further, plural preamplifiers or plural main amplifiers may be arranged in serial for amplification, in order to obtain high output.

In the case where the above-mentioned $CO_2$ laser system for performing multiline amplification is used as the driver laser of the EUV light source apparatus, in the SPF as shown in FIG. 2 or 5, a pitch of the arrangement of apertures is set equal to or less than a half of the shortest wavelength among wavelengths of a $CO_2$ laser beam applied by the driver laser. Further, in the SPF as shown in FIG. 12, a pitch of the wires is set equal to or less than a half of the shortest wavelength among wavelengths of a $CO_2$ laser beam applied by the driver laser. For example, in the case where the shortest wavelength among wavelengths of a $CO_2$ laser beam applied by the driver laser is 9.56 μm, the pitch of the apertures or the pitch of the wires is set equal to or less than 4.78 μm.

the invention claimed is:

1. A laser produced plasma type extreme ultraviolet light source apparatus for generating extreme ultraviolet light by applying a laser beam to a target material, said apparatus comprising:
   a chamber in which extreme ultraviolet light is generated;
   a target supply unit configured to supply a target material to a predetermined position within said chamber;
   a laser beam focusing optics configured to focus a laser beam from a driver laser using a laser gas containing a carbon dioxide gas as a laser medium, for applying the laser beam to the target material supplied by said target supply unit to generate plasma;
   a collector mirror configured to collect the extreme ultraviolet light radiated from the plasma to output the extreme ultraviolet light; and
   a spectrum purity filter provided in an optical path of the extreme ultraviolet light from said collector mirror, and configured to transmit the extreme ultraviolet light and to reflect the laser beam, said spectrum purity filter including a wire grid polarizer having a pitch not larger than a half of a shortest wavelength of the laser beam from said driver laser.

2. The extreme ultraviolet light source apparatus according to claim 1, wherein said spectrum purity filter includes a mesh coated with a material having electrical conductivity on at least a surface thereof.

3. The extreme ultraviolet light source apparatus according to claim 2, wherein said mesh contains one of diamond, diamond-like carbon, silicon carbide, and silicon.

4. The extreme ultraviolet light source apparatus according to claim 2, wherein said material having electrical conductivity contains one of gold and molybdenum.

5. The extreme ultraviolet light source apparatus according to claim 1, wherein said spectrum purity filter includes a mesh coated with a material having electrical conductivity on at least a light incident surface thereof.

6. The extreme ultraviolet light source apparatus according to claim 5, wherein said mesh contains one of diamond, diamond-like carbon, silicon carbide, and silicon.

7. The extreme ultraviolet light source apparatus according to claim 5, wherein said material having electrical conductivity contains one of gold and molybdenum.

8. The extreme ultraviolet light source apparatus according to claim 1, wherein said spectrum purity filter includes a wire grid polarizer having a pitch not larger than substantially 5 μm.

9. The extreme ultraviolet light source apparatus according to claim 1, wherein said driver laser is configured to radiate a laser beam having linear polarization, and said wire grid polarizer is arranged such that an electric field vibration direction of the laser beam from said driver laser and an extending direction of wires are substantially the same.

10. The extreme ultraviolet light source apparatus according to claim 1, wherein said spectrum purity filter includes two wire grid polarizers each having a pitch not larger than substantially 5 μm and arranged orthogonal to each other.

11. The extreme ultraviolet light source apparatus according to claim 1, wherein said spectrum purity filter further includes a holder configured to hold a periphery of said wire grid polarizer such that a surface of said wire grid polarizer is flat.

12. The extreme ultraviolet light source apparatus according to claim 11, wherein said holder is formed with a channel configured to pass a medium for cooling or heating said wire grid polarizer.

13. The extreme ultraviolet light source apparatus according to claim 11, further comprising:
   a mechanism configured to rotate or vibrate said holder.

14. The extreme ultraviolet light source apparatus according to claim 1, wherein:
   said chamber is configured to introduce an etchant gas, and
   said etchant gas contains at least one selected from a hydrogen gas, a halogen gas, a hydrogen halide gas and an argon gas.

* * * * *